(12) United States Patent
Chua

(10) Patent No.: US 6,388,205 B1
(45) Date of Patent: May 14, 2002

(54) PRINTED CIRCUIT BOARD WITH SHIELDED CIRCUITRY

(75) Inventor: Ah Lim Chua, Singapore (SG)

(73) Assignee: Gul Technologies Singapore LTD, Singapore ( * ) Notice: Subject to any disclaimer, the term of this patent is extended or adjusted under 35 U.S.C. 154(b) by 0 days.

(21) Appl. No.: 09/664,261

(22) Filed: Sep. 18, 2000

(30) Foreign Application Priority Data

Nov. 9, 1999 (SG) .......................................... 9905546-9

(51) Int. Cl.[7] ................................................ H01R 9/09
(52) U.S. Cl. ..................... 174/261; 174/35 R; 361/816; 361/818
(58) Field of Search ............................... 174/261, 35 R; 361/818, 816, 800; 439/76.1

(56) References Cited

U.S. PATENT DOCUMENTS 5,252,782 A * 10/1993 Cantrell et al. ........... 174/35 R
5,572,408 A * 11/1996 Anhalt ....................... 361/818
5,833,473 A * 11/1998 Betker et al. ............... 361/800
6,180,876 B1 * 1/2001 Holmes ..................... 174/35 R

FOREIGN PATENT DOCUMENTS

JP 404199790 A * 7/1992 ................. 361/816

* cited by examiner

Primary Examiner—Albert W. Paladini
(74) Attorney, Agent, or Firm—Ladas & Parry

(57) ABSTRACT

A PCB board with in-board EMI shielding in which a prescribed electrical circuitry within a PCB is shielded from EMI by fabricating a uniform metal shielding enclosure therearound. The shielded circuitry may be a single metal trace, a group of interconnected traces in the same or different layers of the same PCB, or a complete electrical circuitry spanning many different layers and locations within the same PCB. Using the same technology, groups of electrical circuitry that require isolation because of EMI may be fabricated together in proximity, with each group shielded from the EMI of the others. The metal shield contains a top shield in a layer above the circuitry, a bottom shield in a layer below the circuitry, and side shields adjacent the circuitry. There is no gap in the shielding structure, except whether the prescribed circuitry connects to another circuitry.

12 Claims, 13 Drawing Sheets

PRINTED CIRCUIT BOARD WITH SHIELDED CIRCUITRY

FIELD OF THE INVENTION

The present invention is related to printed circuit boards and electromagnetic interference (EMI). In particular, the present invention is related to printed circuit boards with shielding against electromagnetic interference.

BACKGROUND OF THE INVENTION

Printed circuit boards (PCB's), including rigid, flexible, single, double and multilayer boards have found important uses in the semi-conductor and electronic industry. A PCB typically contains metallized layers of electrical circuitry or traces separated by dielectric material. Interconnections are provided for electrical connection between the metallized layers. In certain applications, such as audio-amplifiers, microphones and mobile telephones, the electrical circuitry of the PCB generates an electromagnetic field which interfere with the normal operation of other circuitries in the vicinity.

One conventional method of reducing EMI in circuitry embedded in PCB's is to provide metal shield on the surfaces of the board. This shield may be one or more metal plates mounted around the PCB, or a layer of metallic coating plated directly onto the surface of the PCB. Another prior art method involves the plating of metallic traces internally within the inner layers of the PCB adjacent the prescribed trace or traces for which EMI shielding is needed.

FIGS. 1A to 1D show the traces and structures found in the prior art PCB for internal EMI shielding. A simple six-layer PCB is shown with a metal trace 20 in layer L1-3 and another metal trace 22 in layer L1-4. These two traces require EMI shielding. For ease of illustration, only the traces to be shielded and the relevant shielding structures are shown in layers L1-2 to L1-5. Trace 20 is interconnected to trace 22 through metal-coated via 24. Two ground shields 26 and 28 are also plated in layer L1-3 on the two opposing sides of trace 20. Ground shield 21, connected to traces 26 and 28 in layer L1-3, is provided for top shielding of trace 22. Two other grounded traces 30 and 32 are plated in L1-4 on the two adjacent sides of trace 22. They are connected to trace 31, which act as the bottom shield for trace 20. Ground shield 33 is provided in layer L1-2 directly above metal trace 20 to function as top shielding against EMI. Ground shield 35 is provided in layer L1-5 directly below metal trace 22 as bottom shield therefor. Between metallic layers L1-2, L1-3, L1-4 and L1-5 are dielectric layers, denoted as L1-axb where a and b indicate the layers directly above and below it respectively. To provide partial EMI shielding at the dielectric layers, conventional PCB boards are provided with vias 34a and 34b having a coat of metal 36 thereon.

It is clear from the above description of the prior art that the shielding provided within the PCB does not provide good EMI shielding, as there are multiple gaps 38 between vias 34a and 34b that do not provide shielding.

SUMMARY OF THE INVENTION

It is therefore an object of the present invention to provide a PCB board with improved internal EMI shielding.

Accordingly, the present invention provides PCB boards with in-board EMI shielding in which a prescribed electrical circuitry within a PCB is shielded from EMI by fabricating a uniform metal shielding enclosure therearound. The shielded circuitry may be a single metal trace, a group of interconnected traces in the same or different layers of the same PCB, or a complete electrical circuitry spanning many different layers and locations within the same PCB. Using the same technology, groups of electrical circuitry that require isolation because of EMI may be fabricated together in proximity, with each group shielded from the EMI of the others. The metal shield contains a top shield in a layer above the circuitry, a bottom shield in a layer below the circuitry, and side shields adjacent the circuitry.

According to one embodiment of the present invention, the side shields are trenches with metal coating provided adjacent the prescribed circuitry. The side trenches connect the top shield and the bottom shield without gaps. Openings of the uniform metal shield are provided at the sites where the circuitry connects to another circuitry within the same PCB board or with the exterior.

In another embodiment, the side shields are solid walls provided adjacent the prescribed circuitry. The walls are built using electroplating and/or electroless plating as described in detail below. As with the metal coated trenches, the solid walls connect the top shield and the bottom shield to form a uniform enclosure around the prescribed circuitry, except for openings where the prescribed circuitry connects to another circuitry within the same PCB board or with the exterior. The present invention not only provides complete shielding of a circuitry, but also gives substantial internal space savings.

As used herein, a uniform metallic shield refers to the a complete shield absent any non-metallic gaps within the side shields that connect the top shield and the bottom shield.

DESCRIPTION OF THE INVENTION

Figure 1A:
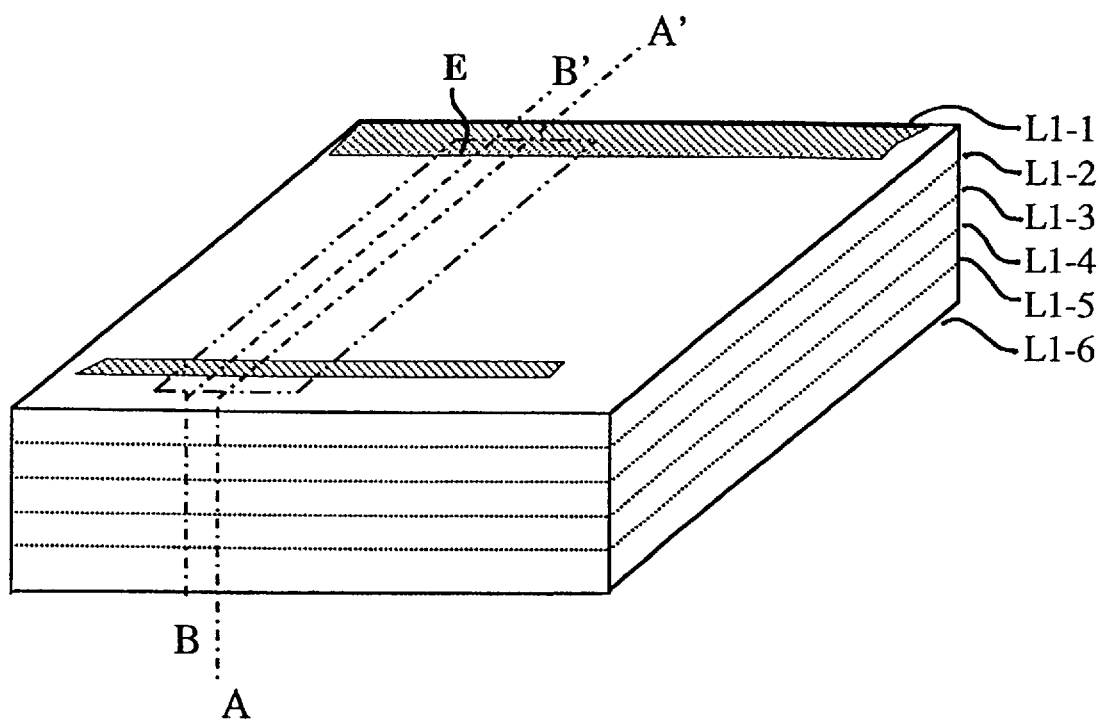
FIG. 1A is a perspective drawing of a piece of a conventional PCB with the various layers indicated by dotted lines.
Figure 1B:
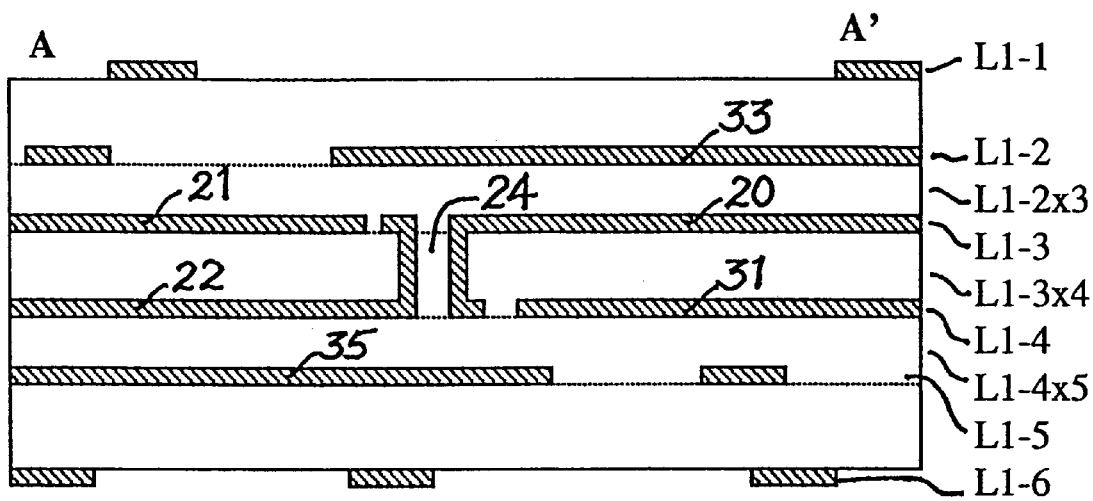
FIGS. 1B and 1C are cross section drawings along lines A-A' and B-B' respectively of the same conventional PCB.
Figure 1C:
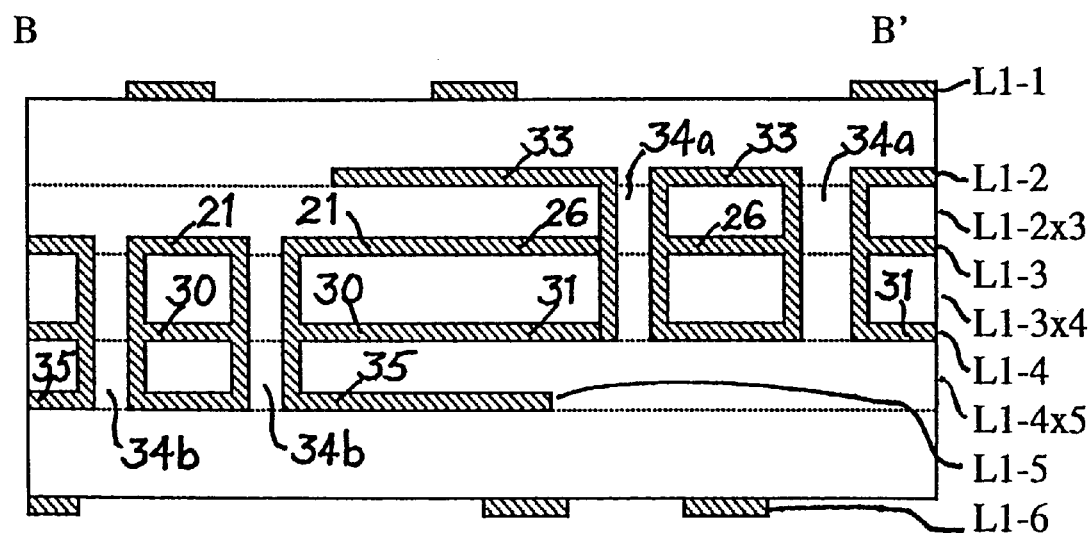
Figure 1D:
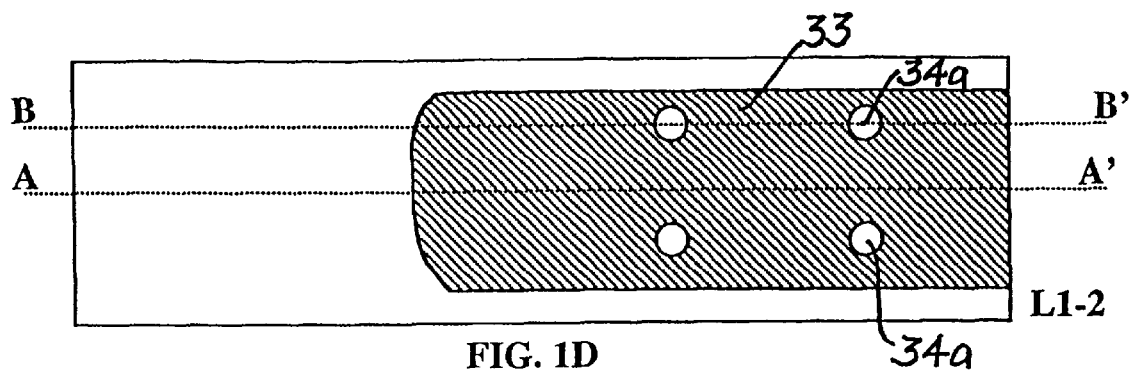
FIGS. 1D-1J are the art work of area E in layers L1-2, L1-2x3, L1-3, L1-3x4, L1-4, L1-4x5 and L1-5 respectively of the PCB shown in FIGS. 1A to 1C.
Figure 1E:
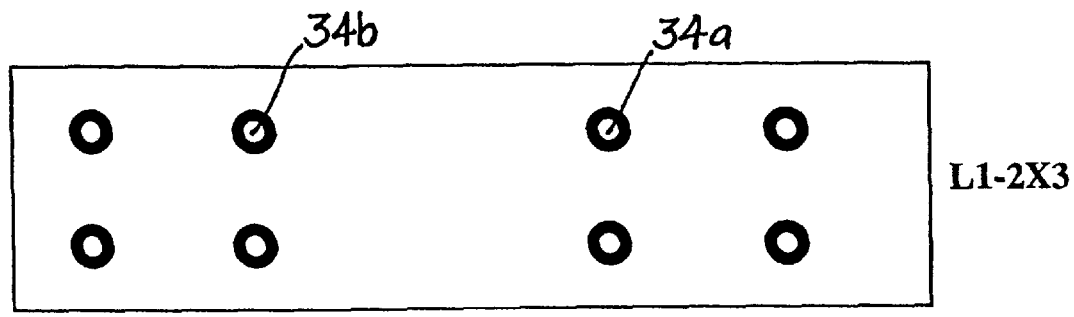
Figure 1F:
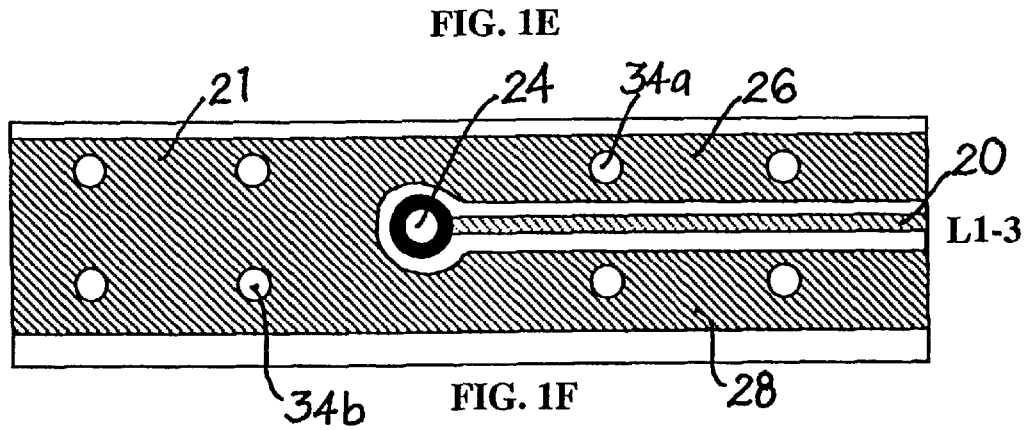
Figure 1G:
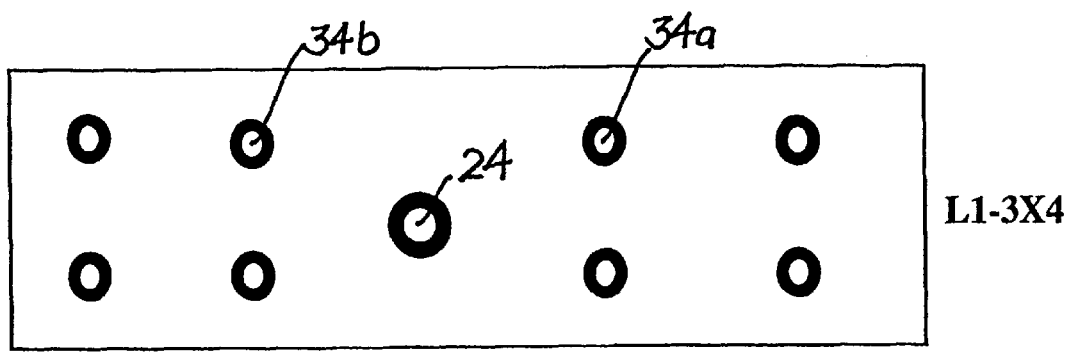
Figure 1H:
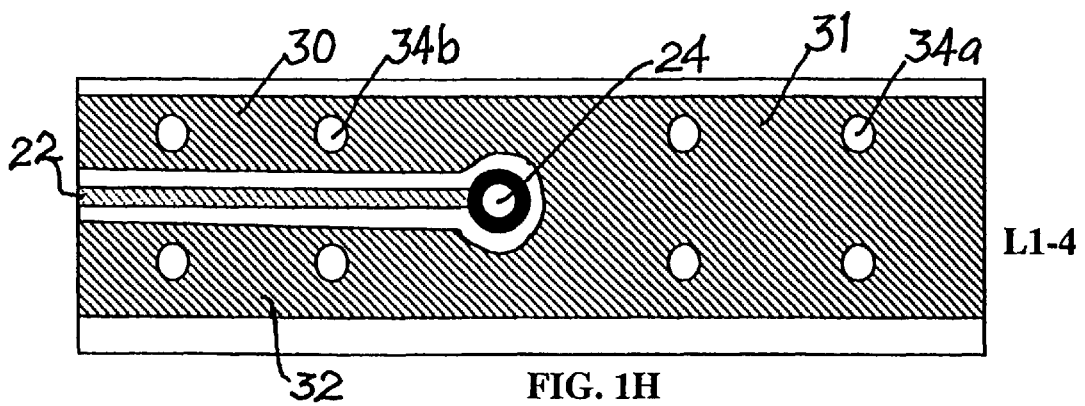
Figure 1I:
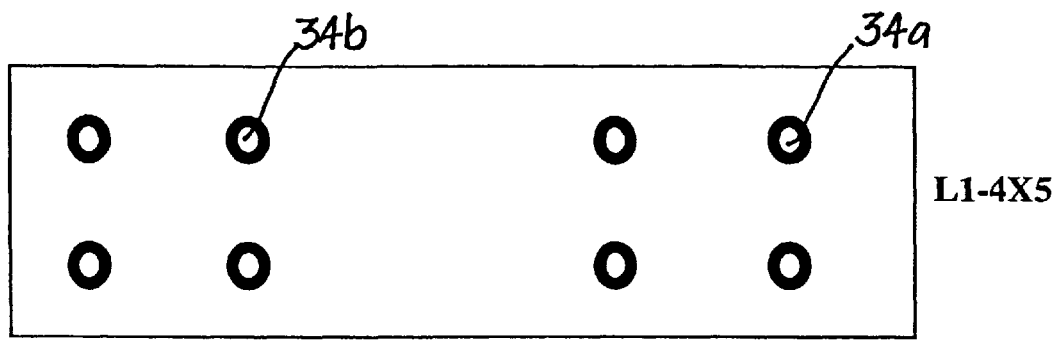
Figure 1J:
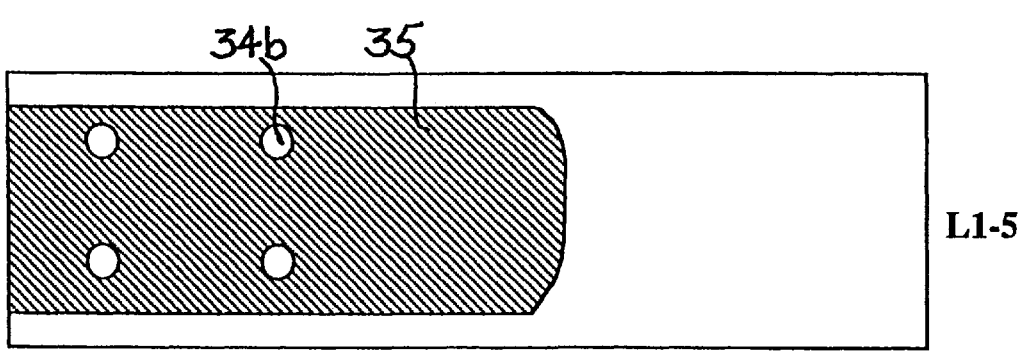
Figure 2A:
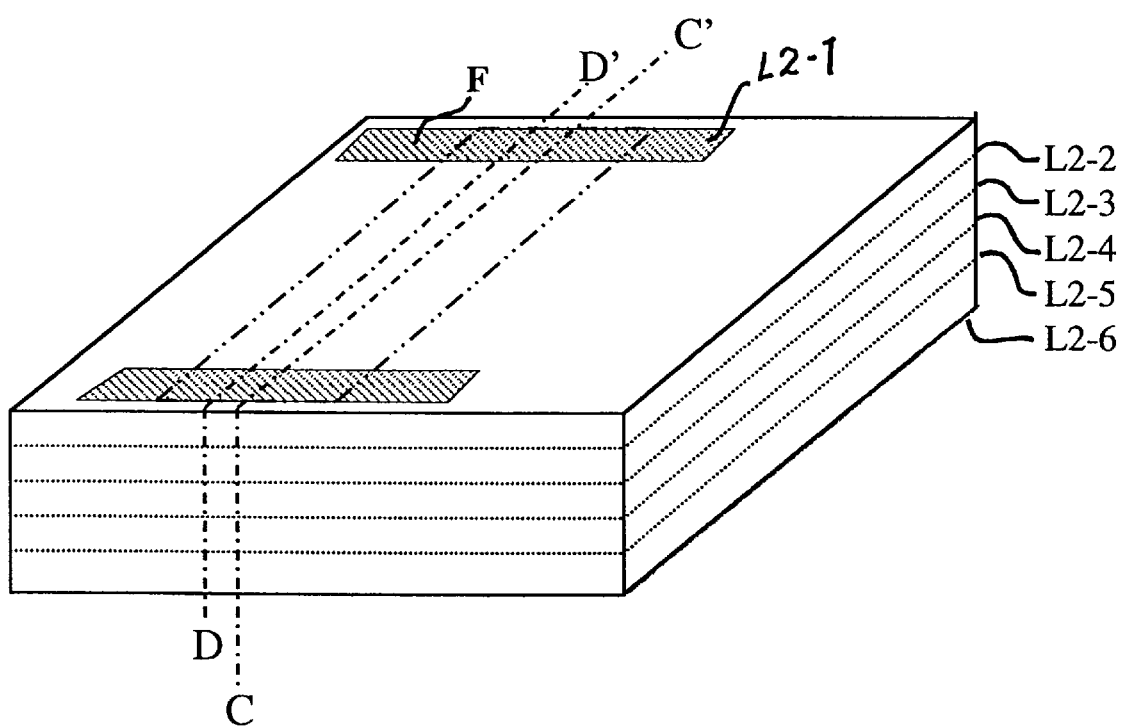
FIG. 2A is a perspective drawing of a part of a PCB according to the present invention with the various layers shown.
Figure 2B:
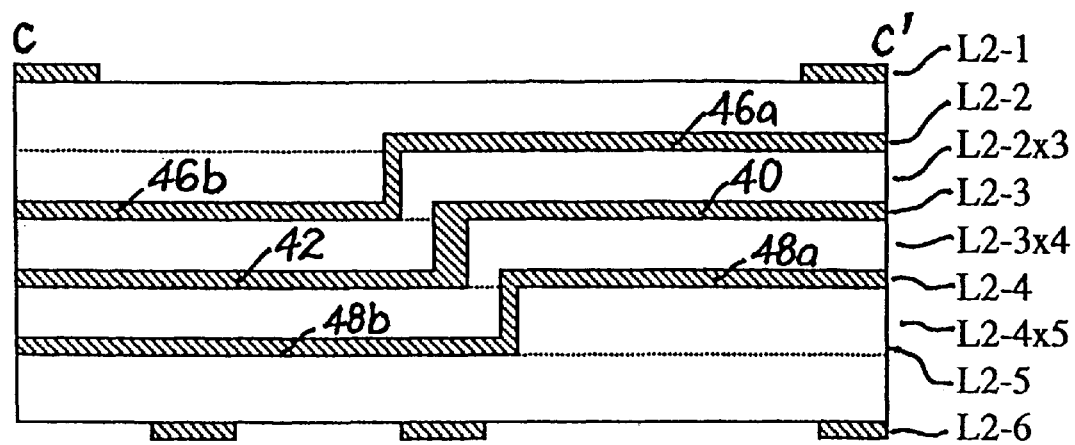
FIGS. 2B and 2C are cross section drawings along lines C-C' and D-D' respectively of the PCB shown in FIG. 2A.
Figure 2C:
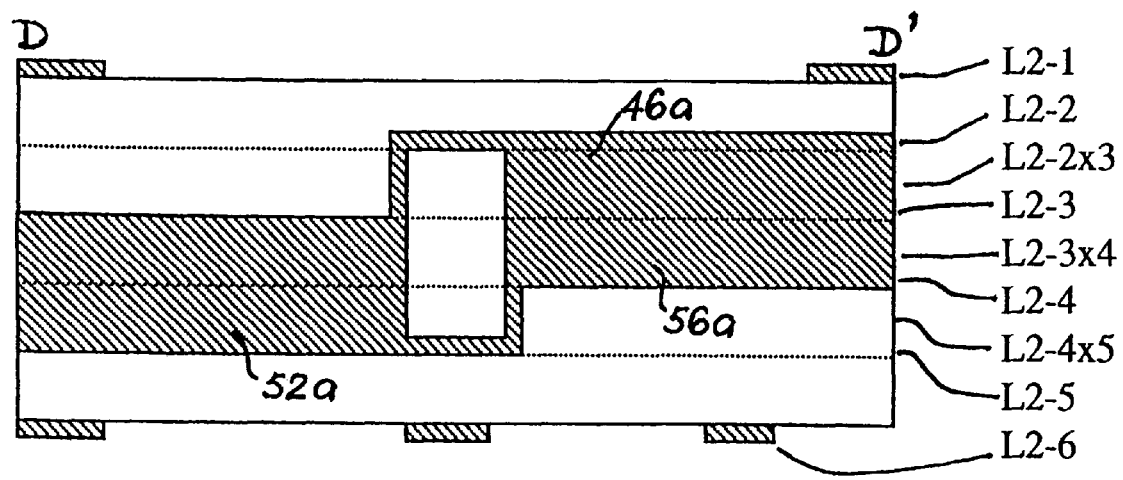
Figure 2D:
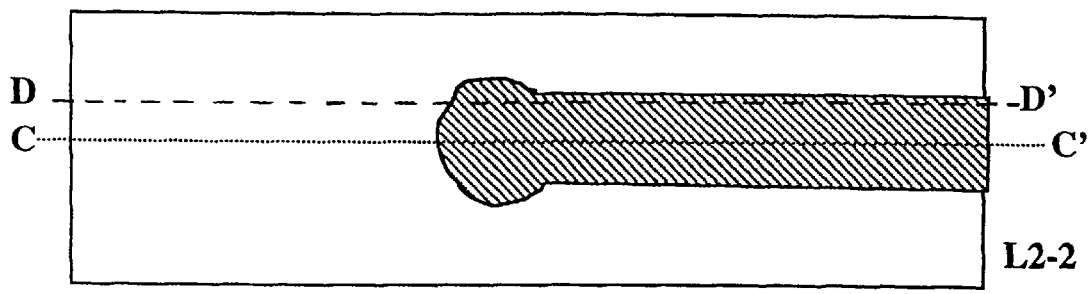
FIGS. 2D-2J are the art work of area F in layers L2-2, L2-2x3, L2-3, L2-3x4, L2-4, L2-4x5 and L2-5 respectively of the PCB shown in FIGS. 2A to 2C.
Figure 2E:
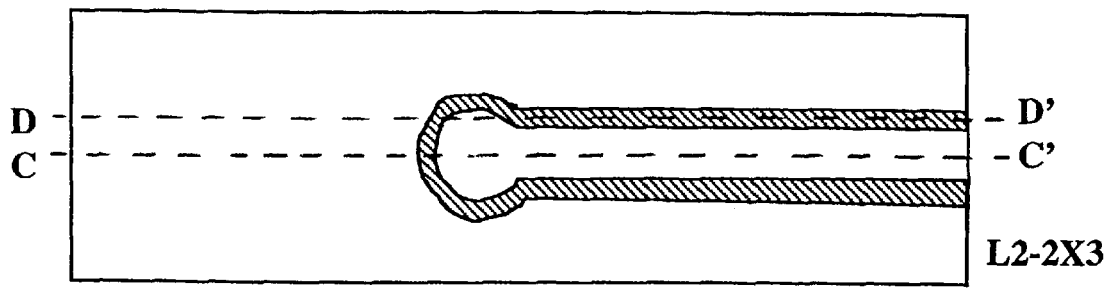
Figure 2F:
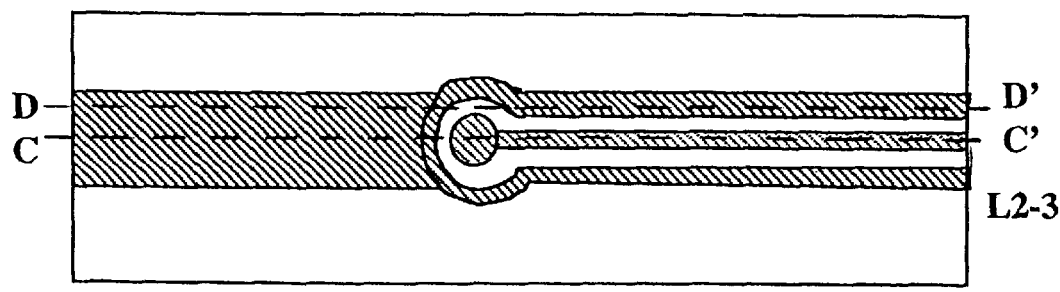
Figure 2G:
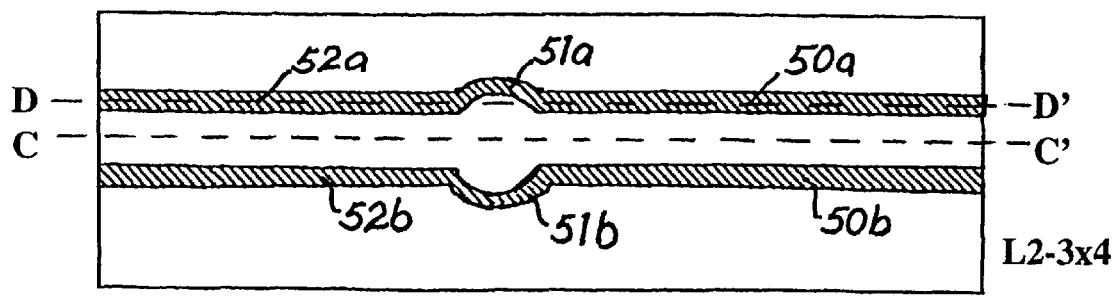
Figure 2H:
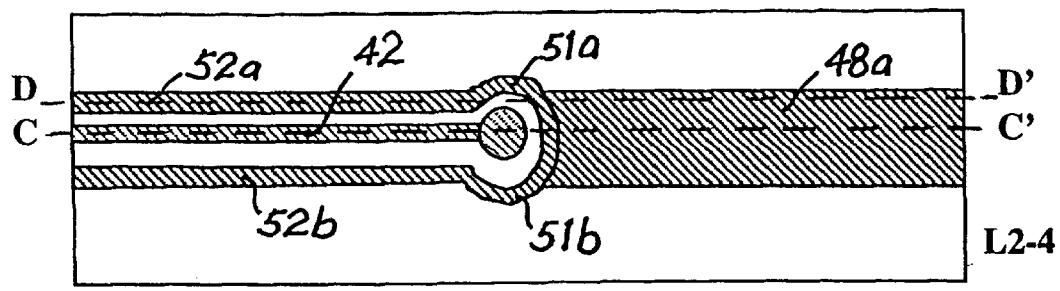
Figure 2I:
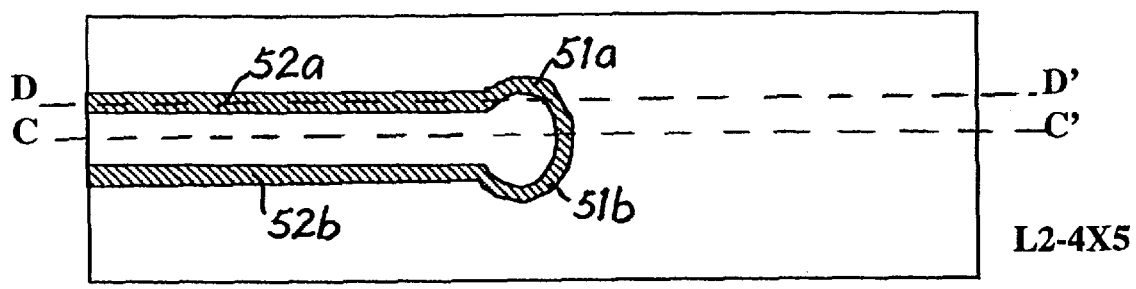
Figure 2J:
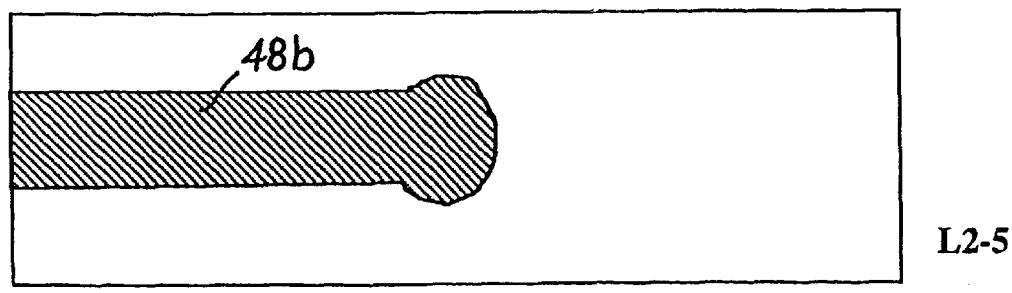

FIGS. 2A–J show an example of a portion of a multi-layer PCB board according to the present invention having metallized layers L2-1, L2-2, L2-3, L2-4, and L2-5. Each of these layers are separated by dielectric material, denoted as L2-axb, where a and b refer to the metallized layer directly above and below it. For ease of illustration, only the relevant traces to be shielded and the corresponding shielding structures are shown in the internal metallized layers. In this example, traces 40 and 42, provided in layers L2-3 and L2-4 are the electrical circuitry that require EMI shielding. Traces 40 and 42 are electrically connected by solid metallic interconnect 44. Ground shield 46a is provided in layer L2-2 directly above trace 40, and ground shield 46b is provided in layer L2-3 and directly above trace 42. Ground shields 46a and 46b together act as the top shield. Ground shield 48a is provided in layer L2-4 directly below trace 40, and ground shield 48b is provided in layer L2-5 directly below trace 42. Ground shields 48a and 48b together act as the bottom shield. Side shields 50a and 50b are provided on the two adjacent sides of trace 40. Side shields 52a and 52b are provided on the two adjacent sides of trace 42. Side shields 51a and 51b are provided on adjacent sides of interconnect 44. The side shields span even in the dielectric interlayers as a continuous wall, as indicated in FIG. 2B. The top, bottom and side shields are joined to form a uniform enclosure (i.e. with no need for gaps), except for openings (not shown) provided at desired points, for example, where the shielded circuitry connect to another circuitry.

Figure 3A:
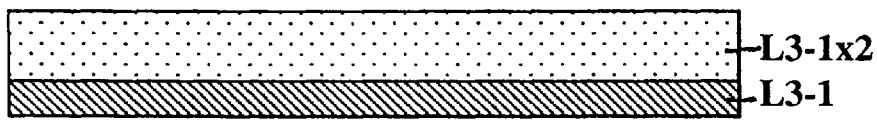
FIGS. 3A-3F show the steps of one method of producing an EMI shield according to the present invention.
Figure 3B:
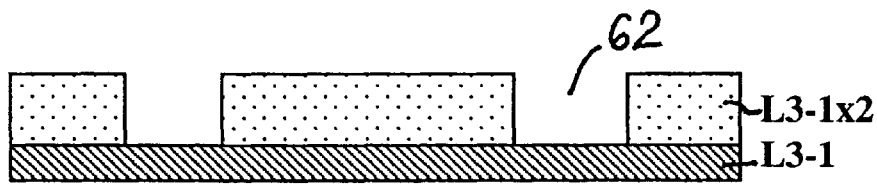
Figure 3C:
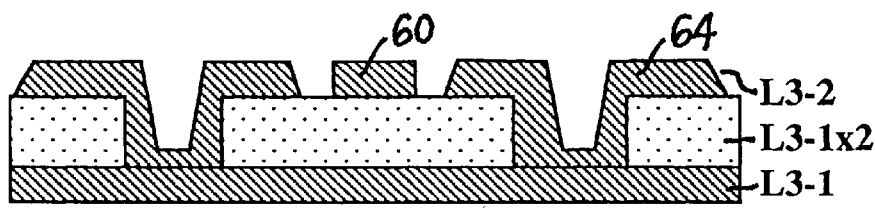
Figure 3D:
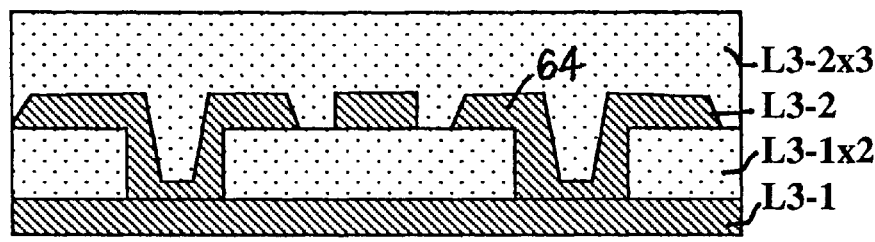
Figure 3E:
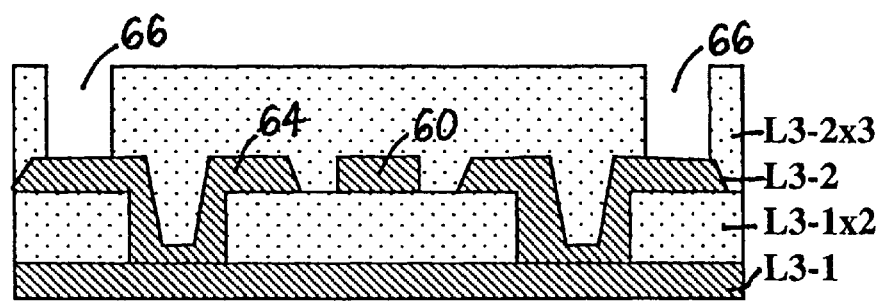
Figure 3F:
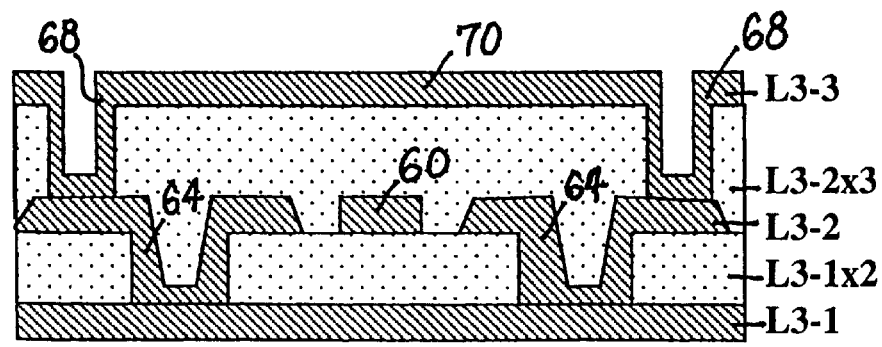

FIGS. 3A–3F show one method of producing the uniform metal shield according to the present invention. In this example, metallic layers L3-1, L3-2 and L3-3 are shown to illustrate the steps involved. Trace 60 is the electrical circuitry to be shielded. For ease of illustration, other traces not directly relevant to the present invention are not shown. Metallic layer L3-1 and dielectric layer L3-1x2 are fabricated according to conventional techniques (FIG. 3A). Trenches 62 are then produced by conventional photolithography or laser technology on the two sides where the side shields are desired (FIG. 3B). Trace 60 and metal side shields 64, together with any other desired metallic patterns (not shown) are then plated onto the prescribed positions to form layer L3-2 using photolithography and electroplating (FIG. 3C). A second dielectric layer is then spread onto layer L3-2 to form layer L3-2x3 (FIG. 3D). The dielectric material used is preferably a liquid to facilitate the filling of trenches 62 remaining within metal coating 64. Trenches 66 are then fabricated in dielectric layer L3-2x3 above side of trenches 62 (FIG. 3E). Side shields 68 are then fabricated as a metal coating in trench 66 within laminated layer L3-2x3. At the same time, the metallization pattern for layer L3-3 is plated, including top metal shield 70 (FIG. 3F). Additional layers of dielectric material and metallic patterns can then be built based on conventional technology. It is understood by one skilled in the art that there can be many layers to the board, and that the same principles may be applied to create shielding in multi-layer circuits.

Figure 4A:
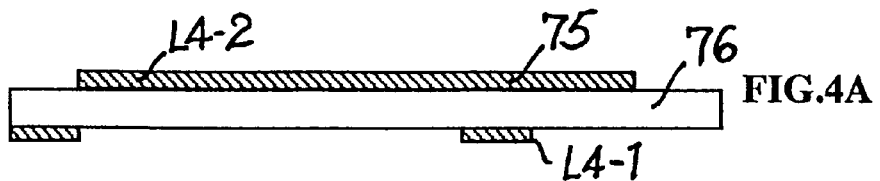
FIGS. 4A-4F show the steps of another method of producing another EMI shield according to the present invention.
Figure 4B:
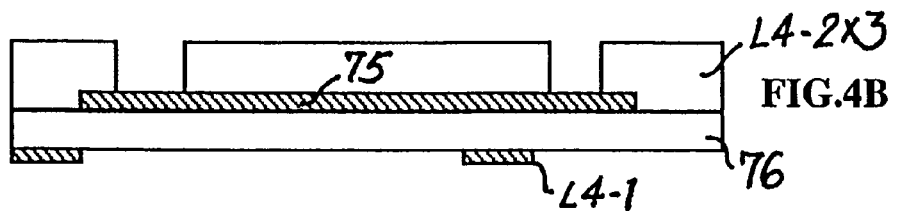
Figure 4C:
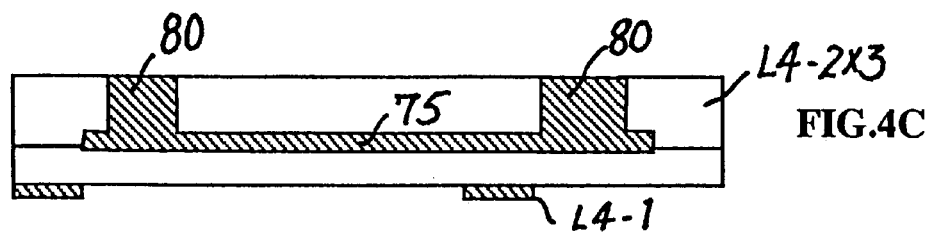
Figure 4D:
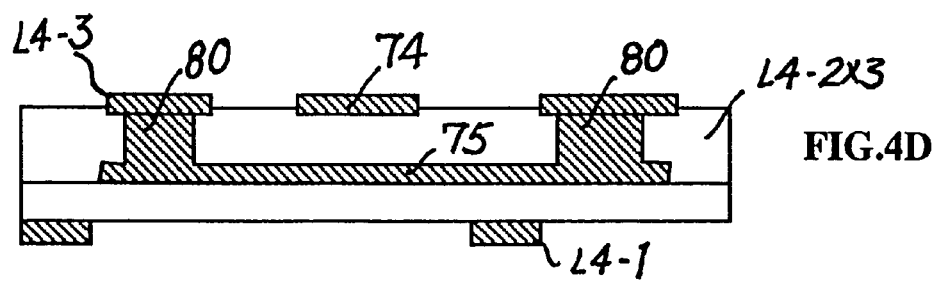
Figure 4E:
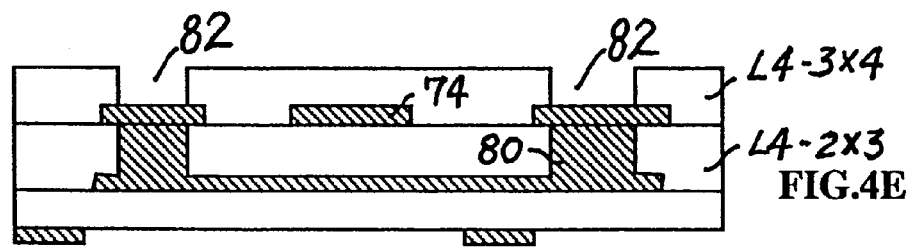
Figure 4F:
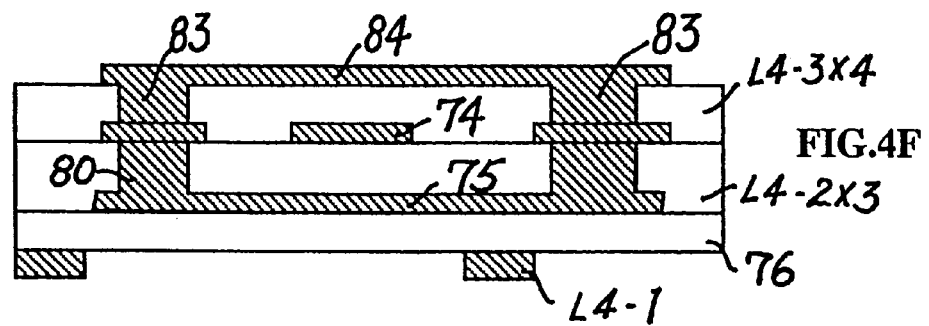

FIGS. 4A–F show another method of producing the uniform metal shield according to the present invention. In this example, trace 74 is the electrical circuitry to be shielded. Layer L4-1 and L4-2 are metal layers provided on opposing sides of core layer 76. Ground metal trace 75, acting as bottom shield for trace 74 is etched onto layer L4-2 (FIG. 4A). For ease of illustration, other metallization patterns typically found in PCBs in the various metal layers are not shown. Dielectric layer L4-2x3 is then layered on, and trenches 78 produced sing photolithography (FIG. 4B). After curing of layer L4-2x3, two solid metal all 80 are produced adjacent the position for trace 74 using electroplating techniques (FIG. 4C). The next metallic layer L4-3, containing trace 74 and ground shield 75 are produced using conventional photolithography, electroplating and metal etching (FIG. 4D). To complete the side shields, another dielectric layer L4-3x4 is layered onto layer L4-3, and trenches 82 produced by lithography directly above walls 80. Electroplating can again be performed to plate solid walls 83 in layer L4-3x4, together with top shield 84. For ease of illustration, other metal traces are not indicated.

Figure 5A:
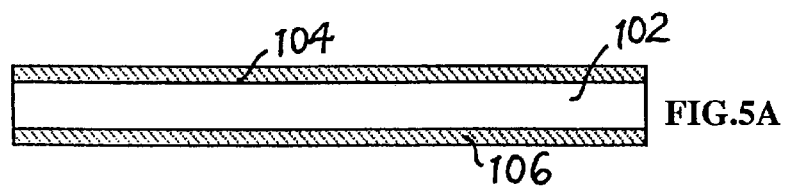
FIGS. 5A-5H show the steps of yet another method of producing another EMI shield according to the present invention.
Figure 5B:
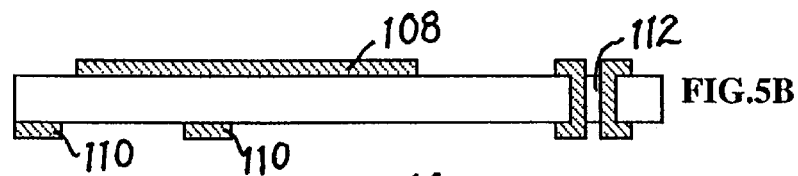
Figure 5C:
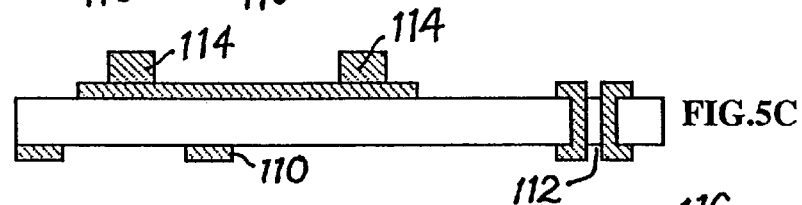
Figure 5D:
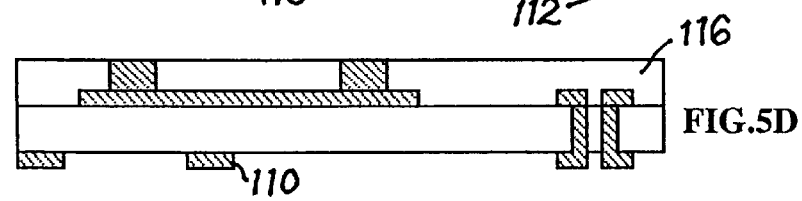
Figure 5E:
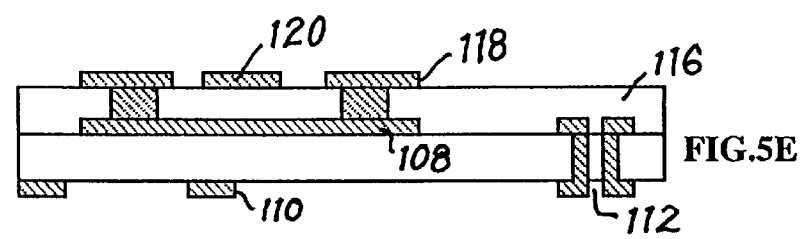
Figure 5F:
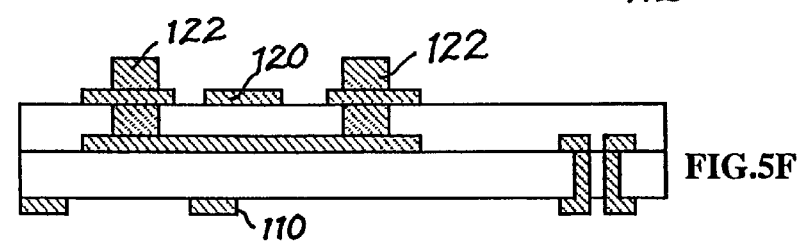
Figure 5G:
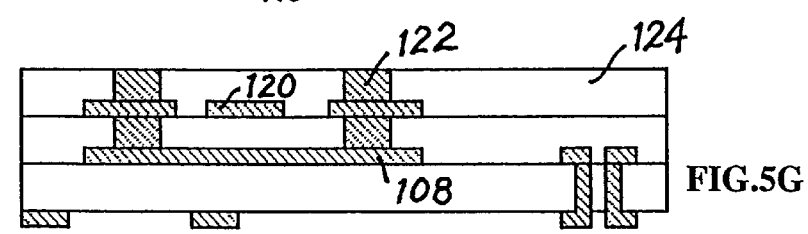
Figure 5H:
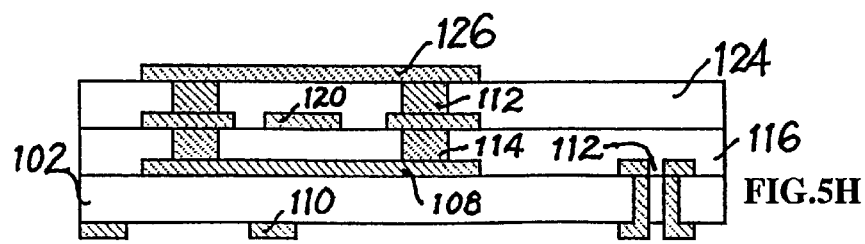

FIGS. 5A–H shows a further example of how the shielding structure according to the present invention may be constructed. In this example, a core layer 102 having second and first metallic layers 104 and 106 respectively on two opposing sides is provided (FIG. 5A). Conventional photolithography, drilling, plating and etching are performed to provide upper trace 108, lower traces 110 and metal coated via 112 (FIG. 5B). Electroplating and etching processes are then performed to produce two solid metallic walls 114 (FIG. 5C). The remaining surfaces are protected by a photoresist according to conventional methods. Dielectric layer 116 is then coated onto the surface of second metallic layer 104 (FIG. 5D). Trace 120 and other features of the third metallic layer 1 18 are then plated onto dielectric layer 116 according to conventional plating and etching (FIG. 5E). To complete the EMI shielding for trace 120, electroplating of solid metal walls 122 on the two adjacent sides of trace 120 is performed using conventional photoresist and electroplating technology. An additional dielectric layer 124 is then layered onto third metallic layer 118 (FIG. 5C). This is followed by conventional photolithography and plating to complete the top shield 126 for trace 120.

Figure 6A:
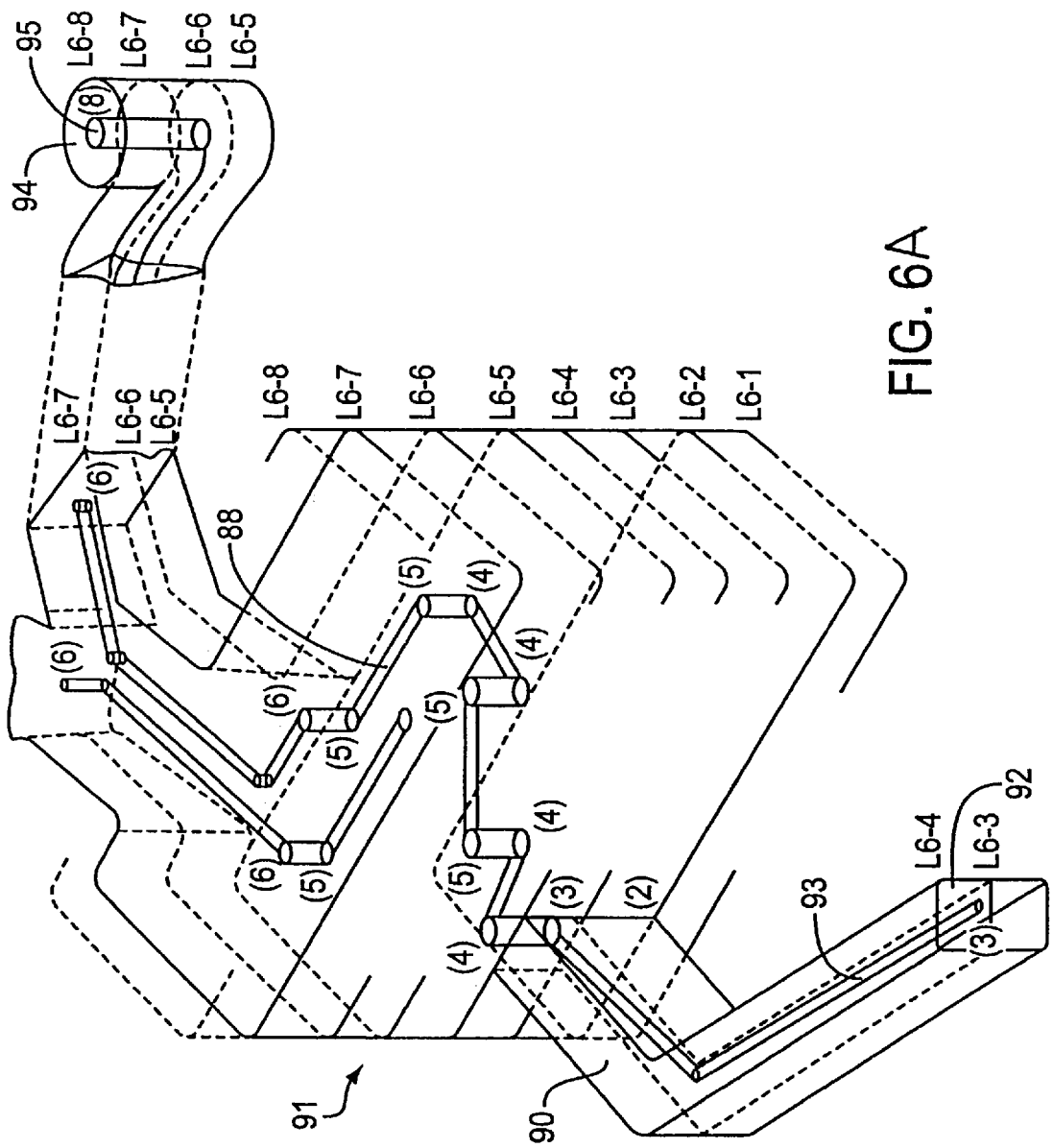
FIG. 6A is a perspective drawing of one interior part of a multilayer PCB in which an area of a PCB board protected by a metal shield for a multilayer electrical circuitry is shown.
Figure 6B:
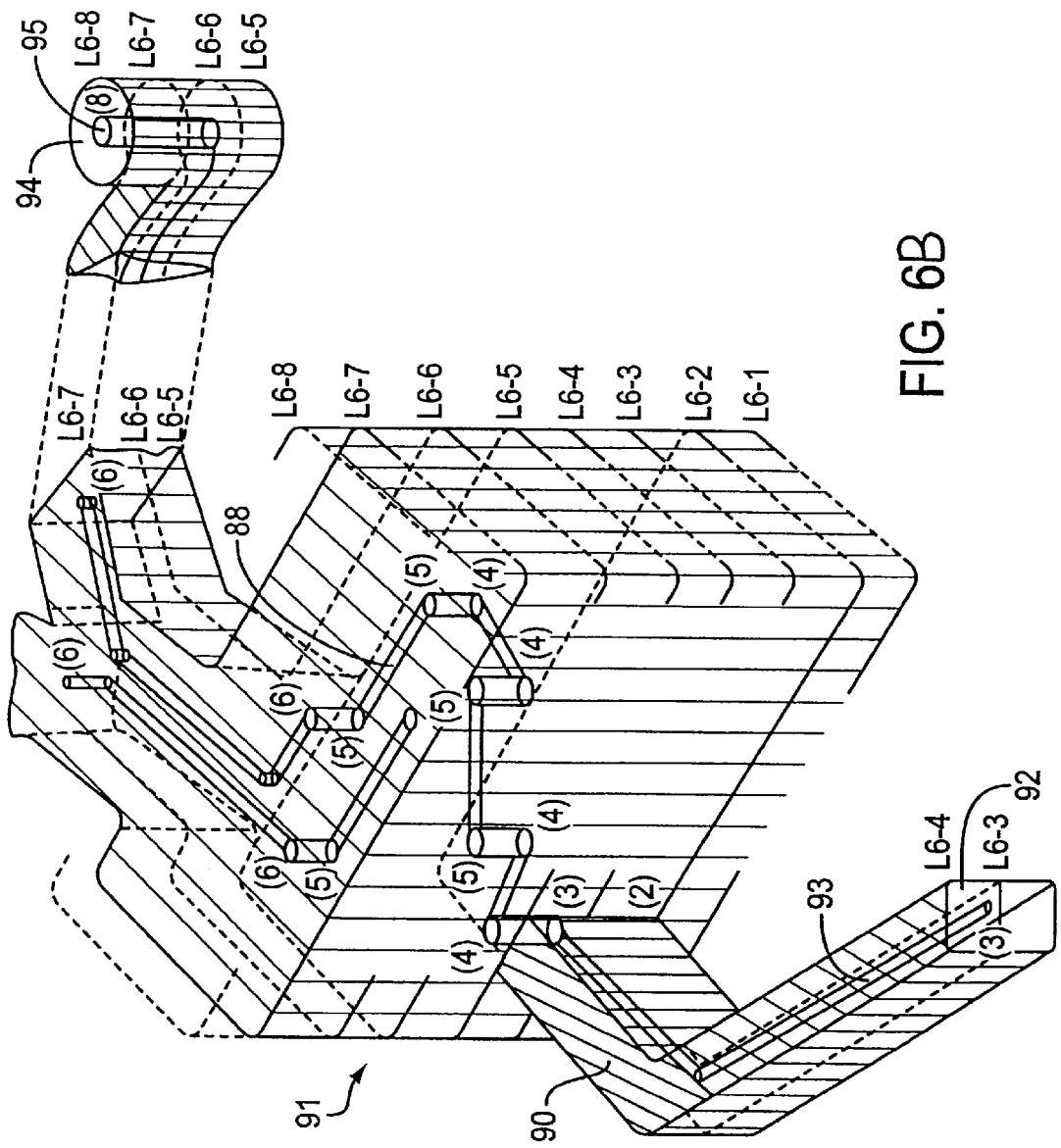
FIG. 6B shows the same area of the PCB board as FIG. 6A, except that the metal shield in shaded for clarity.

The aforementioned examples illustrate the basic principles of how to produce a shield according to the present invention. It is dear to one skilled in the art that the shield according to the present invention may be applied to complex electrical circuitry within a PCB. FIGS. 6A and 6B show one example of a more complex circuitry in which shielding may be provided. In this example, electrical circuitry 88, spanning 6 different layers of an eight-layer PCB 91 (layers L5-1 to L5-8), is shielded by metal shield 90, as shown by the dotted lines in FIG. 6B. For ease of illustration, FIG. 6A shows the same area, but with the metal shield 90 without shading such that the shielded circuitry can be more clearly shown. Metal shield 90, occupies only one area of the PCB, but the remaining portions of the PCB is not shown also for ease of illustration. Circuitry 88 spans layers L5-2 to L5-8. The layer L5-Y in which the various traces of circuitry 88 runs are shown as a reference numeral (Y) in FIG. 6. e.g. Trace 88a is shown with reference numeral (4) to show that it is provided in layer L5-4. It is understood that other circuitry, outside the shield areas but within the same PCB are also provided, but are not shown in FIG. 6 for ease of illustration. Opening 92 is provided for connection of trace 93 of circuitry 88 with another circuitry (not shown) within the same board. Opening 94 allows interconnect 95 to connect with another circuitry in another layer, or with an outer layer on the PCB.

With the teaching provided herein, it is therefore possible for circuitry that normally give EMI can now be produced within the same board and be shield from each other. Complete and uniform shielding is possible at any position in any layer according to the needs of the designer. For example, possible for numerous traces for high frequency signals to be printed adjacent and co-axial to each other and be completely shielded from each other using a side shield therebetween. It is clear that all types of PCBs can utilize the methods disclosed herein. It is contemplated that many changes and modifications may be made by one of ordinary skill in the art without departing from the spirit and the scope of the invention described.

What is claimed is:

1. A printed circuit board comprising an electrical circuitry adapted for electrical connection with a second electrical circuitry, said electrical circuitry having a metal shield therearound, said metal shield forming a box-like enclosure with the electrical circuitry therein, wherein at least three sides of said box-like enclosure being at least partially embedded within said board.

2. A printed circuit board according to claim 1 wherein said board comprises a plurality of metallic layers insulated by dielectric material therebetween, and said electrical circuitry being a trace, a group of interconnected traces within the same metallic layer, or a group of interconnected traces in more than one metallic layer.

3. A printed circuit board according to claim 2 wherein said shield is completely embedded within said printed circuit board.

4. A printed circuit board in accordance with claim 2 wherein the dielectric material within the box-like shielded enclosure and the dielectric material external to the box-like shielded enclosure are identical.

5. A printed circuit board in accordance with claim 4 wherein the dielectric material within the box-like shielded enclosure and the dielectric material external to the box-like shielded enclosure is epoxy.

6. A printed circuit board according to claim 1 wherein said shield comprises:

a top shield above said electrical circuitry;

a bottom shield below said electrical circuitry; and side shields on at least two opposing sides of said circuitry, said side shield joining said top shield to said bottom shield without gaps.

7. A printed circuit board according to claim 6 wherein said side shields are solid metal walls.

8. A printed circuit board in accordance with claim 6 wherein the thickness of the top shield is less than the thickness of either one of the side shields.

9. A printed circuit board in accordance with claim 6 wherein the thickness of the bottom shield is less than the thickness of either one of the side shields.

10. A printed circuit board comprising an electrical circuitry adapted for electrical connection with a second electrical circuitry, said electrical circuitry having a metal shield therearound, said metal shield at least partially embedded within the interior of said board, wherein said shield comprises:

a top shield above said electrical circuitry;

a bottom shield below said electrical circuitry; and side shields on at least two opposing sides of said circuitry, said side shield joining said top shield to said bottom shield without gaps, wherein said side shields are metal coated trenches.

11. A method of providing electromagnetic shielding for electrical circuitry within a multi-layer printed circuit board comprising:

producing a bottom metallic shield in a layer below said circuitry;

producing side metallic shields adjacent said circuitry; and producing a top metallic shield in a layer above said circuitry, wherein said step of producing side metallic shields comprises producing trenches adjacent said circuitry; and plating a layer of metal in said trench.

12. A method according to claim 11 wherein said step of plating the layer of metal in said trench comprises producing solid walls adjacent said electrical circuitry.

* * * * *